(12) United States Patent
Lechner

(10) Patent No.: US 12,087,780 B2
(45) Date of Patent: Sep. 10, 2024

(54) OPTICAL SENSOR DEVICE AND METHOD FOR MANUFACTURING AN OPTICAL SENSOR DEVICE

(71) Applicant: ams International AG, Jona (CH)

(72) Inventor: Franz Lechner, Eindhoven (NL)

(73) Assignee: AMS INTERNATIONAL AG, Jona (CH)

( * ) Notice: Subject to any disclaimer, the term of this patent is extended or adjusted under 35 U.S.C. 154(b) by 756 days.

(21) Appl. No.: 17/288,316

(22) PCT Filed: Sep. 27, 2019

(86) PCT No.: PCT/EP2019/076278
§ 371 (c)(1),
(2) Date: Apr. 23, 2021

(87) PCT Pub. No.: WO2020/083606
PCT Pub. Date: Apr. 30, 2020

(65) Prior Publication Data
US 2021/0375958 A1    Dec. 2, 2021

(30) Foreign Application Priority Data
Oct. 25, 2018  (EP) .................................. 18202693

(51) Int. Cl.
*H01L 27/144*  (2006.01)
*H01L 31/0216*  (2014.01)

(52) U.S. Cl.
CPC .... *H01L 27/1443* (2013.01); *H01L 31/02164* (2013.01)

(58) Field of Classification Search
CPC ............... H01L 27/144; H01L 27/1443; H01L 27/1446; H01L 27/146; H01L 27/14601;
(Continued)

(56) References Cited

U.S. PATENT DOCUMENTS

2008/0237769 A1* 10/2008 Okihara ............ H01L 27/14645
257/435
2016/0211390 A1* 7/2016 Chen ................. H01L 31/02005
(Continued)

FOREIGN PATENT DOCUMENTS

CN  105723193 A  6/2016
CN  105810701 A  7/2016
(Continued)

OTHER PUBLICATIONS

Korean Office Action with English Translation in Korean Application No. 10-2021-7015837 mailed on Nov. 29, 2022, 11 pages.
(Continued)

*Primary Examiner* — John R Lee
(74) *Attorney, Agent, or Firm* — MH2 Technology Law Group LLP

(57) ABSTRACT

An optical sensor device comprises a semiconductor body with a light-sensitive area, metal layers which are arranged above the light-sensitive area and comprise an upper metal layer and a lower metal layer, wherein the upper metal layer is located at a greater distance from the light-sensitive area than the lower metal layer. The optical sensor device further comprises an aperture opening in the metal layers above the light-sensitive area and a via structure, which is arranged outside the aperture opening and interconnects the metal layers and/or the semiconductor body. The via structure is arranged in such a fashion that any straight line that is parallel to the light-sensitive area and traverses the aperture opening between the light-sensitive area and the upper metal layer is limited in both of its opposite directions by the via structure.

18 Claims, 5 Drawing Sheets

(58) Field of Classification Search
CPC .......... H01L 27/1462; H01L 27/14623; H01L 27/14625; H01L 27/14629; H01L 27/14634; H01L 27/14636; H01L 31/0216; H01L 31/02161; H01L 31/02162; H01L 31/02164
See application file for complete search history.

(56) References Cited

U.S. PATENT DOCUMENTS

| | | | |
|---|---|---|---|
| 2016/0299008 A1 | 10/2016 | Manninger | |
| 2017/0336317 A1 | 11/2017 | Tschekalinskij et al. | |
| 2019/0363125 A1* | 11/2019 | Zimmer | ............ H01L 27/14627 |
| 2020/0066926 A1 | 2/2020 | Chen et al. | |
| 2021/0375958 A1* | 12/2021 | Lechner | ............ H01L 27/14629 |

FOREIGN PATENT DOCUMENTS

| | | |
|---|---|---|
| DE | 102016208841 | 11/2017 |
| EP | 2873953 | 5/2015 |
| EP | 3045896 | 7/2016 |
| EP | 3255397 | 12/2017 |
| KR | 1020160088821 A | 7/2016 |

OTHER PUBLICATIONS

Chinese First Office Action issued in Chinese Application No. 2019800680241 mailed on Dec. 26, 2023, with English Translation, 9 pages.

International Search Report and Written Opinion in corresponding International Application PCT/EP2019/076278 mailed on Jan. 8, 2020, 13 pages.

Korean Notice of Allowance issued in Korean Application No. 10-2021-7015837 mailed on Aug. 1, 2023, with English Translation, 8 pages.

* cited by examiner

OPTICAL SENSOR DEVICE AND METHOD FOR MANUFACTURING AN OPTICAL SENSOR DEVICE

CROSS-REFERENCE TO RELATED APPLICATIONS

The present application is the national stage entry of International Patent Application No. PCT/EP2019/076278, filed on Sep. 27, 2019, and published as WO 2020/083606 A1 on Apr. 30, 2020, which claims the benefit of priority of European Patent Application No. 18202693.0, filed on Oct. 25, 2018, all of which are incorporated by reference herein in their entirety.

FIELD

The present disclosure relates to an optical sensor device and to a manufacturing method of such a sensor device.

BACKGROUND OF THE INVENTION

Optical sensor devices based on semiconductor technologies are widely used in various different applications ranging from light detection to imaging applications employed in electronic devices such as mobile phones, smartphones, tablet computers and laptops. Due to modern sensor devices being highly integrated devices that are becoming more and more compact, undesired crosstalk between different light-sensitive parts of the sensor device, for example caused by stray light, have become a significant issue. In addition, the functionality of active circuitry arranged within the sensor devices may be influenced by electromagnetic radiation that is not blocked by conventional light protection measures and impinges on the circuitry.

SUMMARY

This disclosure provides an improved concept of an optical sensor device with reduced optical crosstalk.

Typically, integrated semiconductor devices comprise stacks of metallic layers that are interconnected by means of vias for providing electrical connections for an application-specific integrated circuit, ASIC, of the sensor device, such as a readout circuit. For optical sensors, the metal layers may alternatively, or in addition, serve the purpose to define apertures for light-sensitive areas, i.e. to limit the field of view of light-sensitive structures of the sensor device.

The improved concept is based on the idea of providing an optical sensor device comprising a stack of metal layers, in which vias are arranged in such a fashion that no direct path is provided between active circuitry and light-sensitive structures of the sensor device.

In particular, an optical sensor device according to the improved concept comprises a semiconductor body having a light-sensitive area and metal layers arranged above the light-sensitive area that comprise an upper metal layer and a lower metal layer. The upper metal layer is hereby located at a greater distance from the light-sensitive area than the lower metal layer. The sensor device further comprises an aperture opening in the metal layers above the light-sensitive area as well as a via structure arranged outside the aperture opening and interconnecting the metal layers and/or the semiconductor body.

The via structure of such an optical sensor device is arranged in such a fashion that any straight line that is parallel to the light-sensitive area and traverses the aperture opening between the light-sensitive area and the upper metal layer is limited in both of its opposite directions by the via structure.

The semiconductor body is, for example, a substrate such as a silicon substrate that comprises active circuit such as a CMOS-compatible ASIC. For example, the active circuitry is arranged on a surface of the substrate or is partially disposed within the substrate. The light-sensitive area may be a surface or a layer of a light-sensitive structure, wherein the light-sensitive structure is configured to convert electromagnetic radiation incident on the structure into an electric current based on the photoelectric effect. For example, the light-sensitive structure is an integrated photodiode with the light-sensitive area being one of its surfaces.

The metal layers are arranged above the light-sensitive area which is parallel or coincides with a surface of the semiconductor body, such as a top surface. In this context, 'above' means an arrangement in a vertical direction, which is more or less perpendicular to a main extension plane of the semiconductor body. A main extension plane of the metal layers may be oriented parallel to the light-sensitive surface. In the vertical direction, the lower metal layer is arranged closer to the light-sensitive area than the upper metal layer. Voids in between the metal layers may be filled by a dielectric material such as an oxide.

The metal layers substantially cover the surface of the semiconductor body. For example, the surface is completely covered except for the light-sensitive area above which the aperture opening in the metal layers is arranged. Shape and dimensions of the aperture opening may correspond to a shape and dimensions of the light-sensitive area. If the light-sensitive area is, for example, of rectangular shape, the aperture opening in the metal layers may be of rectangular shape as well.

The via structure interconnects the metal layers and/or the semiconductor body. For example, the via structure interconnects the semiconductor body and the lower metal layer, the lower metal layer and the upper metal layer, and/or the semiconductor body and the upper metal layer. An arrangement of the via structure is chosen such that electromagnetic radiation such as light, which is propagating parallel to and above the light-sensitive area between the light-sensitive area and the upper metal layer, is blocked by the via structure and therefore does not reach active circuitry elements of an ASIC on the semiconductor body, for instance.

In some embodiments, the via structure comprises a plurality of vias.

A via structure comprising multiple vias may be employed for pointwise interconnection of the semiconductor body and the metal layers.

In some further embodiments, each of the plurality of vias has a rectangular, in particular a square, or a circular cross-section.

Typically, vias have circular or square cross-sections. In some cases, even though originally designed with a rectangular cross-section, vias may have a cylindrical shape, i.e. a circular cross-section, or a rectangular shape with rounded corners after manufacturing of the sensor device is finished. This effect depends on the fabrication process and is typically caused by chemistry and isotropy of etching steps. In some cases, a via may have a conical shape characterized by a larger cross-section on one end of the via, e.g. the end of the via facing away from the semiconductor body, compared to its cross-section on the other end of the via, e.g. the end of the via facing the semiconductor body. For example, the cross-section on the end may be close to being circular while the cross-section on the other end may be close to being rectangular. This effect has to be taken into account for the via structure such that the finalized via structure is characterized by vias with appropriate sizes, shapes and spacing.

In some embodiments, the plurality of vias is arranged in rows around the aperture opening following a longitudinal direction that is transverse to any straight line that is parallel to the light-sensitive area and traverses the aperture opening between the light-sensitive area and the upper metal layer. Furthermore, the vias succeed one another within the rows at distances forming a pattern that is the same for each of the rows. In such an embodiment the rows are arranged beside each other with their longitudinal directions being aligned. The patterns of neighboring ones of the rows are shifted in the longitudinal direction relative to one another.

A possible arrangement of the plurality of vias is the arrangement in rows, or in rows and columns, around the aperture opening. Having multiple rows of vias with the same pattern provides a simple design according to the improved concept, in which the limitation of the straight line is realized by neighboring rows being shifted with respect to each other such that any direct path through the via structure is prevented.

In some further embodiments, the vias succeed one another within the rows at equal distances.

A regular pattern comprising, for example, vias of equal shape and size in combination with a constant spacing between two respective vias with a row further simplifies the design. Following this strategy, only a small number of neighboring rows is required in order to achieve the prevention of direct paths through the via structure. For example, merely three neighboring rows may be sufficient.

In some further embodiments, the aperture opening is rectangular and the longitudinal directions of the rows are parallel to sides of a rectangle formed by the aperture opening.

For a rectangular light-sensitive surface, the rows may be arranged parallel to sides of the light-sensitive surface such that also in this case direct paths are limited by the via structure along the sides of the rectangular surface but also at the corners.

In some embodiments, the via structure comprises a ring structure.

A ring structure is an alternative way of the via structure that entirely surrounds the aperture opening, and therefore the light-sensitive surface, such that no direct path leads through the ring structure. For example, a first ring may be arranged to interconnect the semiconductor body and the lower metal layer, and a second ring may be arranged to interconnect the lower and the upper metal layer. Moreover, a combination of a ring structure and a plurality of vias also provides a possible solution. For example, a ring structure may interconnect the semiconductor body and the lower metal layer while individual vias according to one of the embodiments described above interconnect the metal layers.

In some embodiments, at least a part of the via structure is made of an electrically conductive material, in particular a metal.

Apart from limiting direct paths away from the light-sensitive surface according to the improved concept, vias are conventionally used to electrically connect circuit elements of the semiconductor body such as elements of an ASIC, to the metal layers. For example, the electrical connection provides electrical access to a readout circuit of the sensor device through the vias that connect the semiconductor body to contact paths of the metal layers. The vias in such an embodiment are through substrate vias, blind or varied vias, for instance.

In some embodiments, the metal layers comprise at least one further metal layer arranged between the lower metal layer and the upper metal layer.

In order to further increase electrical connectivity and/or to further shape the field of view of the light-sensitive area, additional metal layers may be employed leading to a thicker stack of metal layers in the vertical direction. According to the improved concept, the via structure in these embodiments interconnects the metal layers among each other as well as the metal layers with the semiconductor body. In this way, limitation of any straight line parallel to the light-sensitive area and traversing the light-sensitive area between the semiconductor body and the upper metal layer is maintained.

In some embodiments, the optical sensor device further comprises a further light-sensitive area and a further aperture opening in the metal layers above the further light-sensitive area. Moreover, the optical sensor device in these embodiments further comprises a further via structure arranged outside the further aperture opening and interconnecting the metal layers and/or the semiconductor body.

The further via structure in these embodiments is arranged in such a fashion that any straight line that is parallel to the further light-sensitive area and traverses the further aperture area between the further light-sensitive area and the upper metal layer is limited in both of opposite directions by the further via structure.

Analogous to embodiments of the sensor device with one light-sensitive area, the improved concept may be extended to optical sensor devices that comprise more than one light-sensitive area. These multiple light-sensitive areas may be provided by multiple integrated photodiodes, for example, and each comprise a via structure that blocks any direct path away from the respective light-sensitive area. In this way, not only crosstalks between each of the light-sensitive areas and an ASIC on the semiconductor body are prevented, but also crosstalks between the light-sensitive areas.

In some embodiments, the vias are arranged as a means for limiting horizontal light propagation between the light-sensitive area, a further light-sensitive area of the semiconductor body and/or an application-specific integrated circuit, ASIC, of the semiconductor body.

The light propagation in these embodiments is limited in a straight line that is parallel to the light-sensitive area and traverses the optical sensor device between the light-sensitive area and the upper metal layer.

In some embodiments, the light-sensitive area is configured to generate an electrical signal based on electromagnetic radiation incident on the light-sensitive area, in particular light in the visible, ultraviolet and/or in the infrared spectral range.

Depending on the application, the light-sensitive area may be characterized by a broadband sensitivity or a sensitivity in a specific wavelength range of the electromagnetic radiation.

The object is further solved by electronic devices that comprise an optical sensor device according to one of the embodiments described above.

The optical sensor device of such an electronic device may be configured as a light sensor, such as an ambient light sensor, a proximity sensor or a time-of-flight sensor, for instance.

The object is further solved by a method for manufacturing an optical sensor device. The method comprises providing a semiconductor body having a light-sensitive area, arranging metal layers above the light-sensitive area, wherein the metal layers comprise an upper metal layer and a lower metal layer. The upper metal layer is thereby located at a greater distance from the light-sensitive area than the lower metal layer and an aperture opening is arranged in the metal layers above the light-sensitive area. The method further comprises arranging a via structure outside the aperture opening, wherein the via structure interconnects the metal layers and/or the semiconductor body. The via structure is arranged in such a fashion that any straight line that is parallel to the light-sensitive area and traverses the aperture opening between the light-sensitive area and the upper metal layer is limited in both of its opposite directions by the via structure.

Further embodiments of the method become apparent to the skilled reader from the embodiments of the optical sensor device described above.

BRIEF DESCRIPTION OF THE DRAWINGS

The following description of figures of exemplary embodiments may further illustrate and explain aspects of the improved concept. Components and parts of the optical sensor device with the same structure and the same effect, respectively, appear with equivalent reference symbols. Insofar as components and parts of the optical sensor device correspond to one another in terms of their function in different figures, the description thereof is not repeated for each of the following figures.

DETAILED DESCRIPTION

Figure 1:
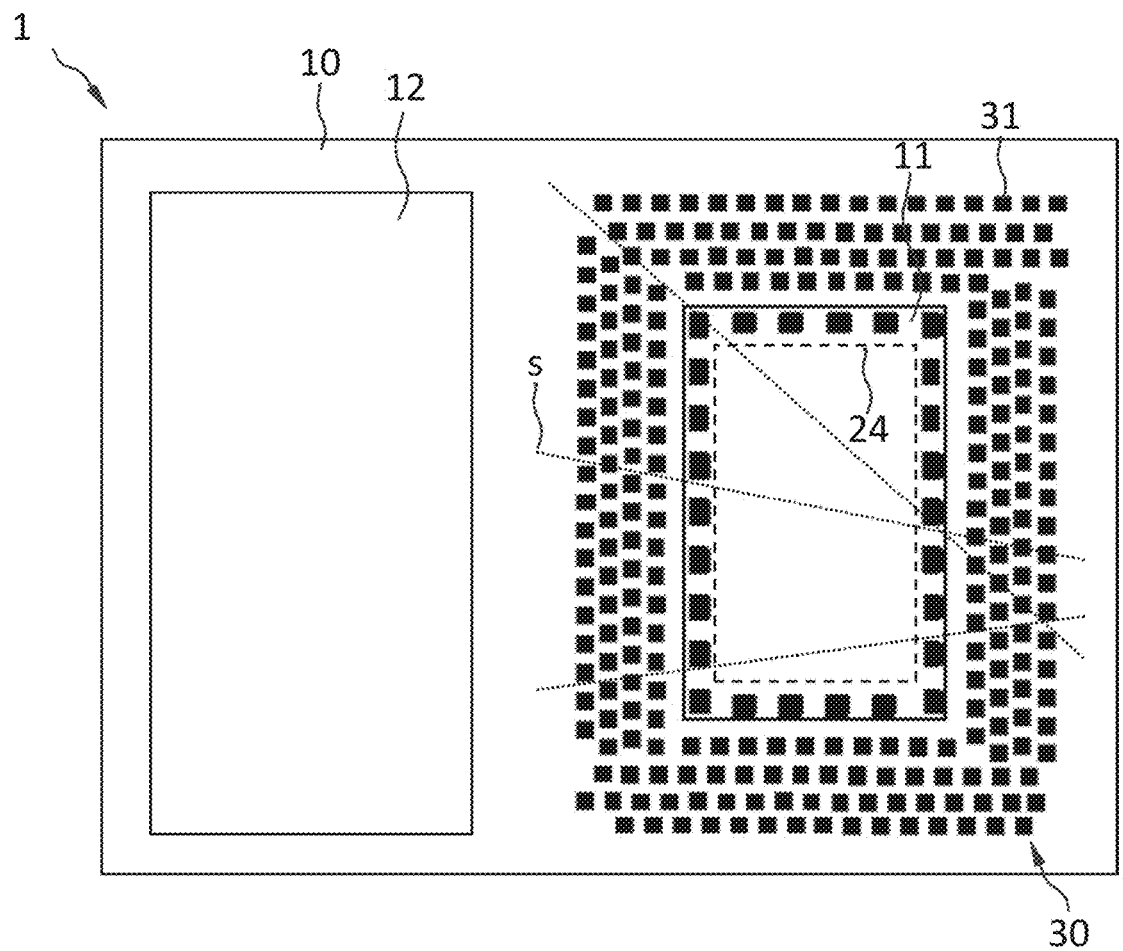
FIG. 1 shows a plan view of an exemplary embodiment of an optical sensor device according to the improved concept.

FIG. 1 shows a plan view of an exemplary embodiment of an optical sensor device 1. The device 1 shown comprises a semiconductor body 10 with a light-sensitive area 11 and an application-specific integrated circuit, ASIC, 12. For example, the semiconductor body 10 is provided by a substrate die of a semiconductor material such as silicon. The light-sensitive area 11 and circuitry elements of the ASIC 12 are arranged on a surface of the semiconductor body 10, beneath the surface or partially disposed within the surface, for example. The light-sensitive area 11 may be a photon-capturing surface of a photodiode. In this example, the light-sensitive area 11 has a rectangular shape, but may in general have an arbitrary shape.

Above the surface of the semiconductor body 10, i.e. in a vertical direction perpendicular to the main plane of extension of the semiconductor body 10, metal layers 20 are arranged, which are not shown in this drawing. The metal layers in this embodiment are configured to cover the semiconductor body 10 substantially excluding the light-sensitive area 11. To this end, the metal layers 20 comprise an aperture opening 24 arranged above the light-sensitive area 11. The shape of the aperture opening 24, which is shown as a dashed line, corresponds in this embodiment to the shape of the light-sensitive surface 11.

The optical sensor device 1 shown further comprises a via structure 30 comprising a plurality of vias 31. The vias 31 are arranged in such a fashion that any direct path given by a straight line S that is parallel to the light-sensitive area 11 and traverses the aperture opening 24 between the light-sensitive area 11 and an upper metal layer 21 of the metal layers 20 is limited in both of its opposite directions by a via 31.

The vias 31 may be through-substrate vias, blind or buried vias, trenches and/or contacts. The vias 31 may be filled with a material which is opaque at a specific wavelength range in the visible, i.e. 400-800 nm, the infrared, i.e. 800-1000 nm and/or the ultraviolet domain, i.e. 200-400 nm, for example. Some of the vias 31 may be filled with an electrically conductive material such as a metal.

Figure 2:
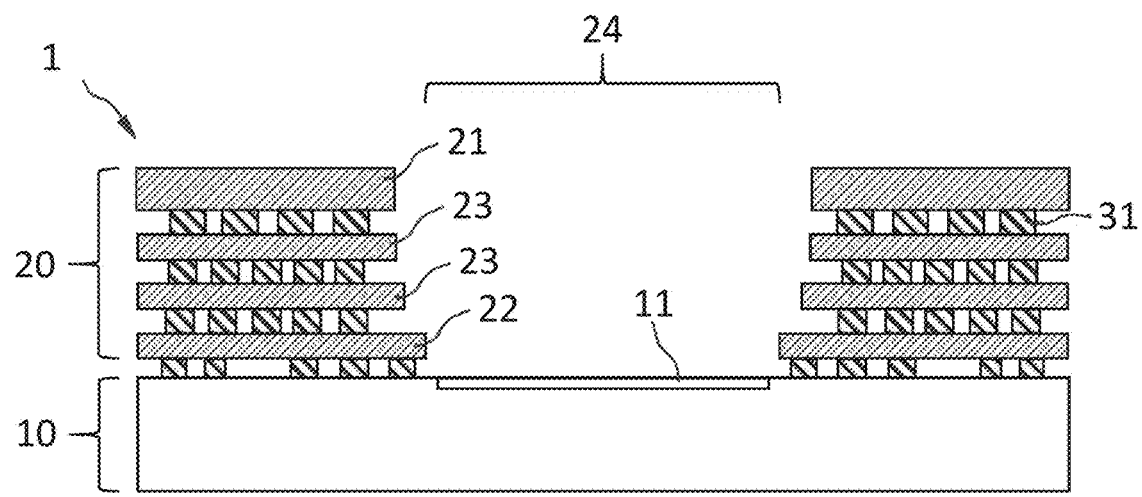
FIG. 2 shows a cross-section view of an exemplary embodiment of an optical sensor device.

FIG. 2 shows a cross-section view of an exemplary embodiment of an optical sensor device 1. In this cross-section view, the metal layers 20 are shown, which are arranged above a surface of the semiconductor body 10. The metal layers in this embodiment comprise an upper metal layer 21, a lower metal layer 22 and further metal layers 23 arranged in between the upper metal layer 21 and the lower metal layer 22. Also apparent in this cross-section view is the aperture opening 24 defined by voids of the metal layers 20 arranged above the light-sensitive surface 11 of the semiconductor body 10. The vias 31 of the via structure 30 interconnect the metal layers 20 and the semiconductor body 10. Some of the vias 31 may electrically connect circuitry elements of the semi-conductor body 10, e.g. contacts of a readout ASIC, to contact pads arranged on a surface of the upper metal layer 21 facing away from the semiconductor body 10, for example.

Figure 3:
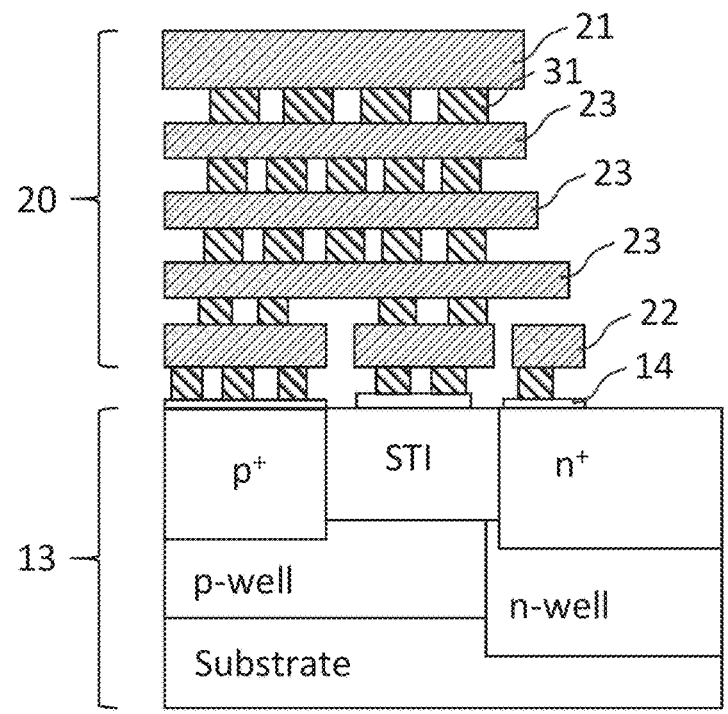
FIG. 3 shows a cross-section view of a further exemplary embodiment of an optical sensor device.

FIG. 3 shows another cross-section view of part of an optical sensor device 1. The figure shows the employment of a conventional integrated PIN photodiode 13 comprising a shallow trench isolation, STI, as an intrinsic semiconductor region in between doped p-type and an n-type semiconductor regions. The n-type semiconductor region therein acts as the photon-capturing region and is therefore arranged at the aperture opening 24. Contact pads 14 arranged on surfaces of the photodiode 13 provide electrical connections which may be interconnected through the metal layer 20 by means of vias 31 to contacts on the upper metal layer 21, for example.

Figure 4:
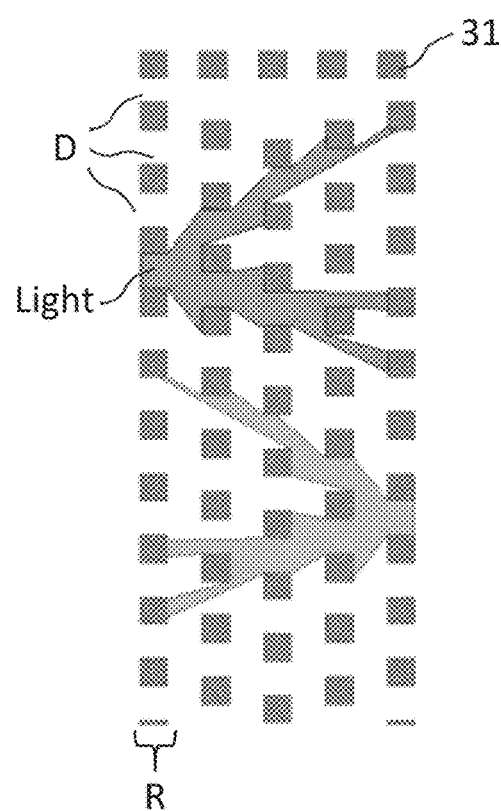
FIG. 4 shows a schematic diagram of an exemplary embodiment of a via structure according to the improved concept.

FIG. 4 shows a schematic diagram of an exemplary embodiment of a via structure 30 according to the improved concept. The vias 31 of the via structure 30 in this example have a square cross-section and are arranged in rows R. A pattern P of the vias 31 in each row R is defined by distances D separating the vias. In this embodiment, the distance D between the vias is constant within the rows R. Multiple rows R are arranged beside each other with their longitudinal directions aligned and the pattern P shifted with respect to the neighboring lines. This enables the desired effect that there is no direct path through the via structure that is not limited by at least one of the vias 31. This ensures that light entering the via structure 30 on one side at any point and with any direction cannot propagate through the via structure 30 and leave it on the opposite side. This is illustrated by means of the darkened regions for two light cones entering the via structure 30.

Figure 5:
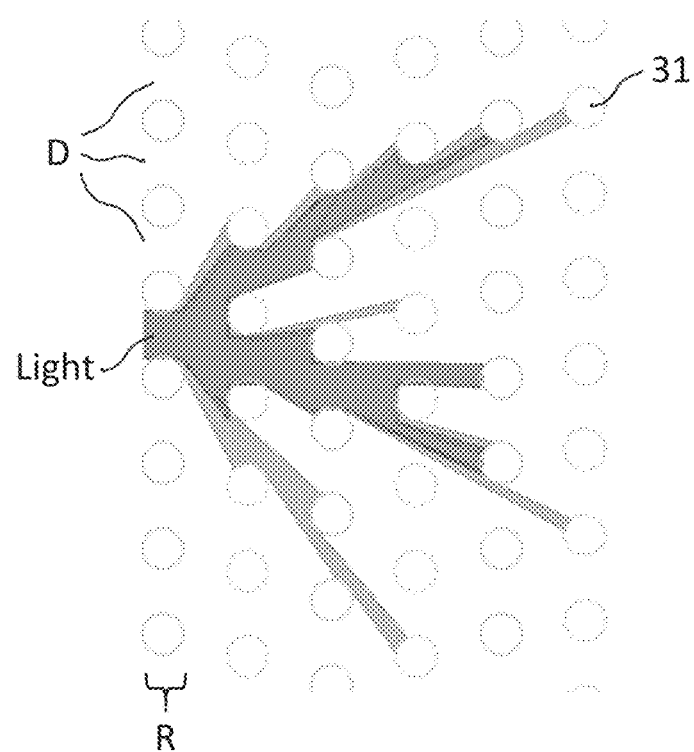
FIGS. 5 to 11 show schematic diagrams of further exemplary embodiments of a via structure.

FIG. 5 shows a further exemplary embodiment of a via structure 30. In contrast to FIG. 4, here the vias 31 are characterized by a circular cross-section. Typically, due to the properties of etchants used during the manufacturing process of the sensor device 1, vias 31 designed with a rectangular cross-section turn out as vias with a rectangular cross-section having rounded corners or an oval or circular cross-section. However, this can be accounted for during designing the via structure 30 such that also in this case direct paths through the via structure 30 are prevented.

Figure 6:
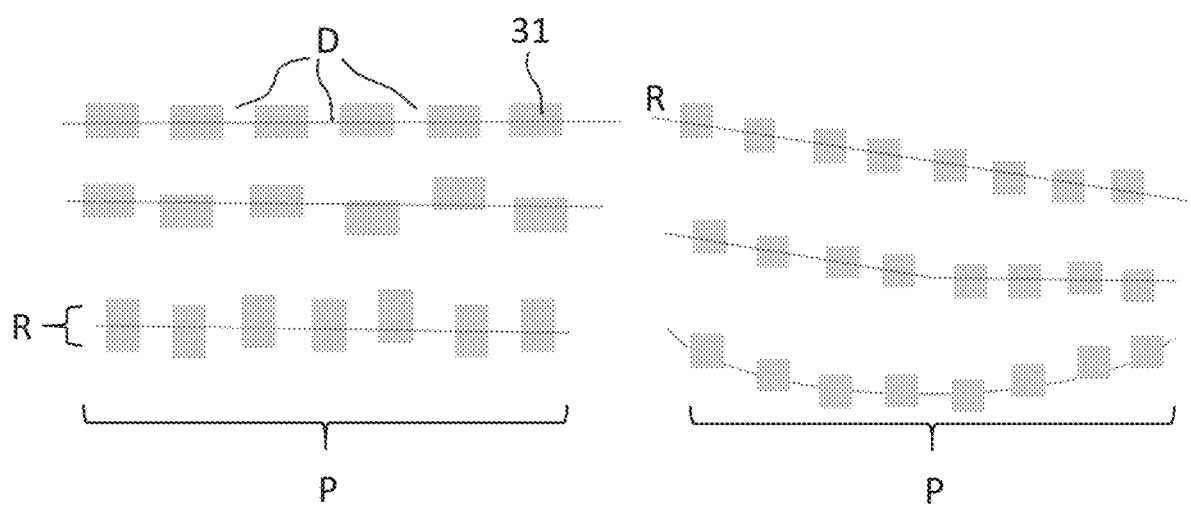

FIG. 6 shows a schematic diagram of further exemplary embodiments of a via structure 30. In this figure, different arrangements of vias 31 within a row R are shown. The rows R serve the purpose as a placement line, along which the vias may be placed in a predetermined pattern P. The placement line R may be a straight line, an arch or may comprise straight line segments that are angled with respect to each other. The vias 31 may be arranged along the respective placement line with predetermined distances D fixed by the respective pattern P. For example, the distance D between all vias 31 of a row R varies or is constant. In addition, the pattern P may comprise a shift of the vias in a predetermined direction, e.g. a direction which is perpendicular to the placement line at the location of the respective via 31.

Figure 7:
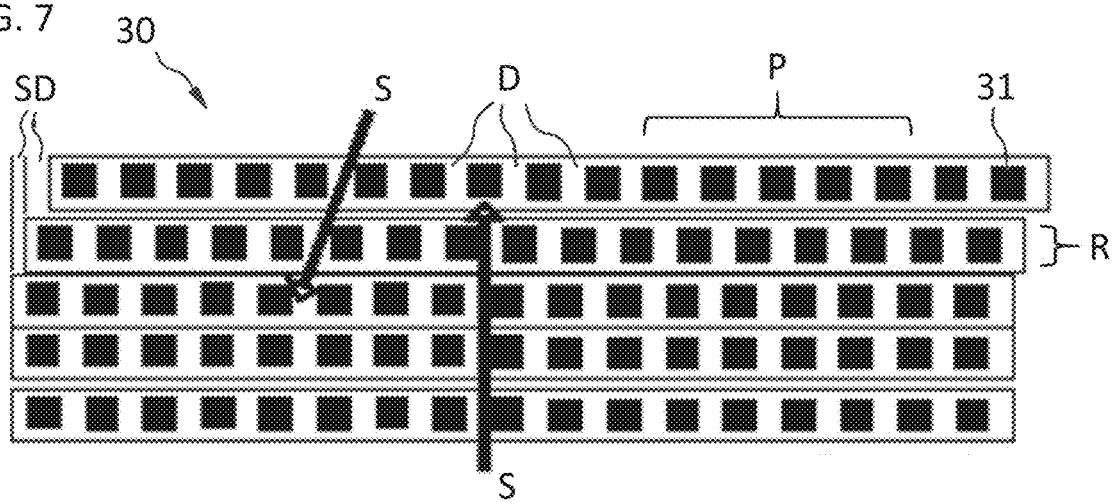
Figure 8:
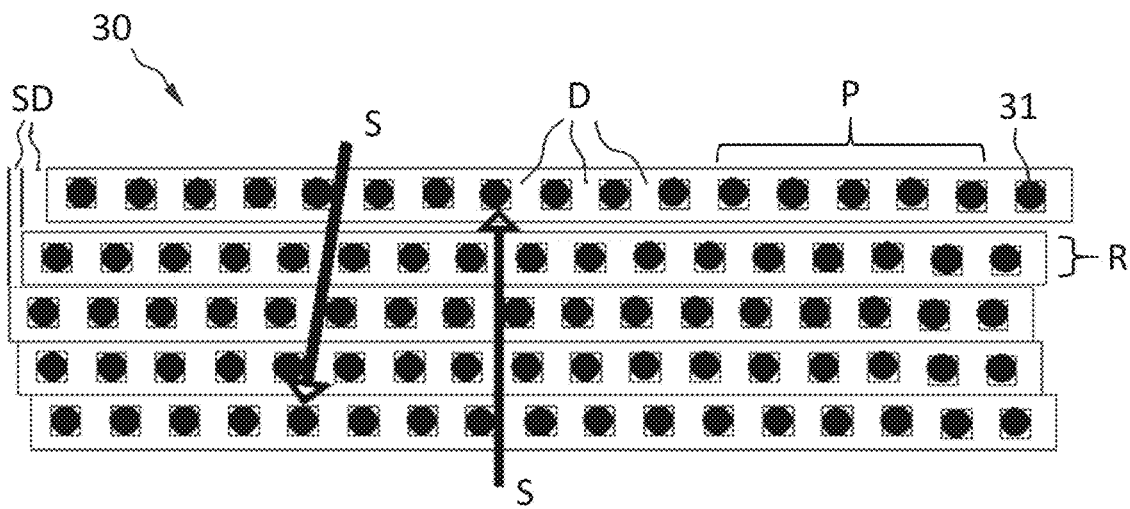
Figure 9:
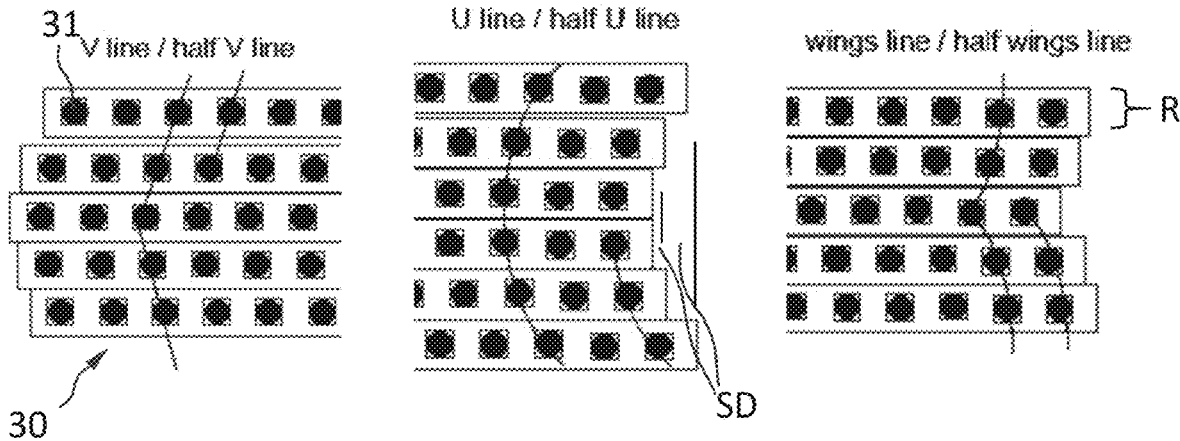

FIGS. 7 to 9 show different embodiments of S section of a via structure 30. The shown sections may correspond to a section arranged along one side of a rectangular light-sensitive area 11, for example. The via structures 30 comprise multiple rows R that are arranged beside each other, in this case with a constant separation distance, with their longitudinal directions aligned and the pattern P shifted with respect to the neighboring lines.

FIG. 7 shows rows R of the via structure 30, which are characterized by patterns P of the vias 31 that are all arranged at a constant distance D with respect to a neighboring via 31 within the respective row R. By shifting at least one of the rows R along its longitudinal direction, limitation by at least one via 31 of any straight line S through the via structure 30 is achieved.

FIG. 8 shows an alternative embodiment, in which the square cross sections of the vias 31 are replaced by the final circular cross-section after the manufacturing is finished. By shifting the rows R each by a respective shifting distance SD in their longitudinal direction, the afore-mentioned limitation of any straight line S is still achieved.

FIG. 9 shows different resulting shapes of the via structure that are realized by appropriate choices of the shifting distance SD of each row. Neighboring vias in different rows may form line patterns such as a V-line, a U-line or a wings line, for example, in order to achieve the intended prevention of direct paths S through the section of the via structure 30.

Figure 10:
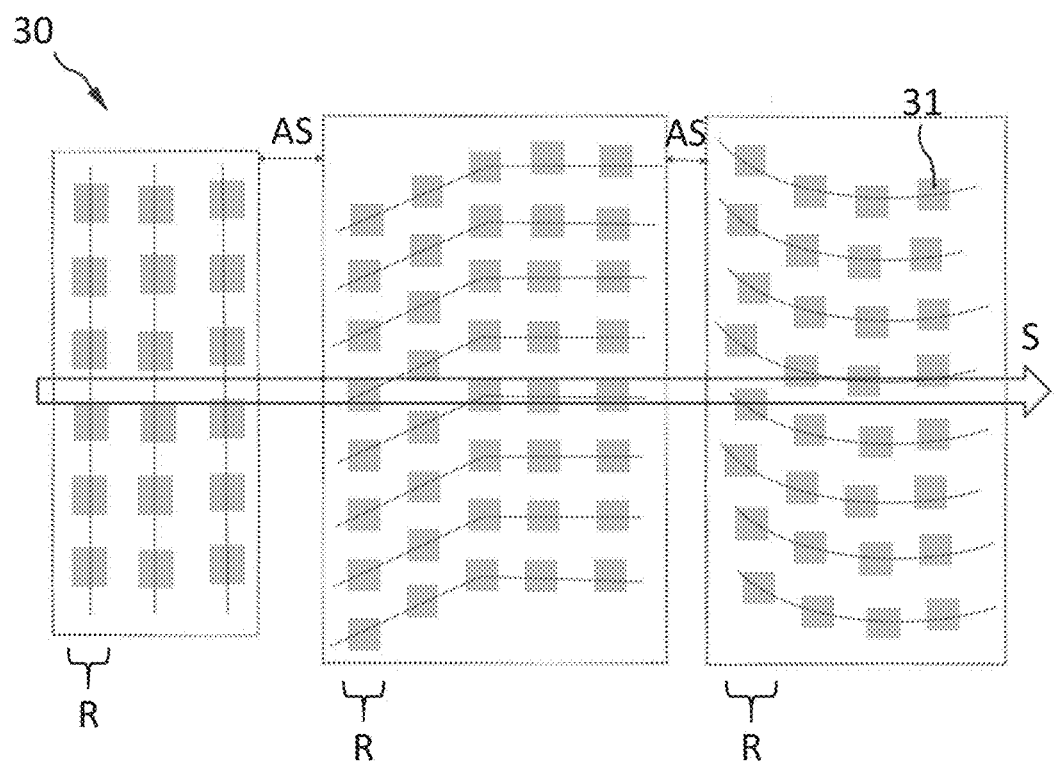

FIG. 10 shows an arrangement of a section of a via structure 30 in multiple arrays. Arranging the vias 31 of a section of a via structure 30, for example on one side of the light-sensitive area 11 in arrays may further increase the limitation of direct paths S through the via structure 30. For example, a first, a second and a third array differ from each other in terms of the shifting distance SD of individual rows R within the respective arrays. For instance, the shifting distance SD is chosen to realize the different line patterns according to the examples shown in FIG. 9. In addition, the arrays may be separated from each other with varying array spacing AS.

Figure 11:
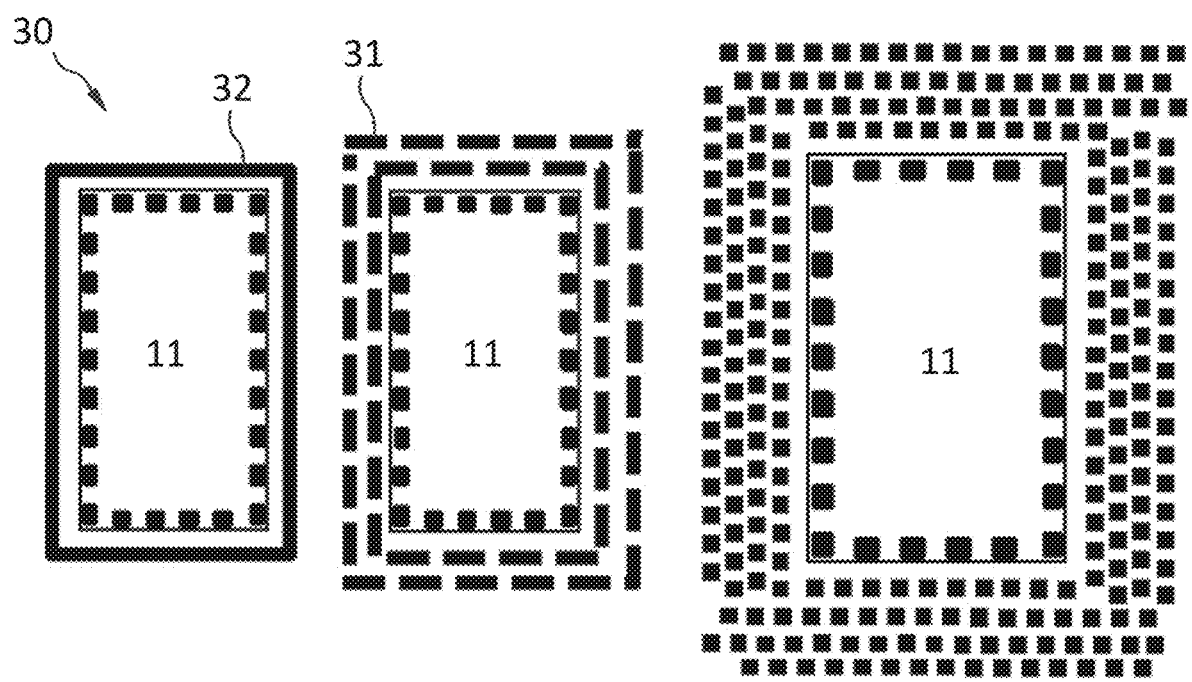

FIG. 11 shows different rectangular arrangements of vias 31 surrounding a rectangular light-sensitive surface 11. All examples possess vias 31 with a rectangular cross section above the light-sensitive surface 11, for example for contacting connections of the light-sensitive surface 11 through the metal layers 20. To achieve the limitation of any straight line S through the via structure 30, the light-sensitive area 11 may be surrounded by a ring structure 32 completely blocking any light propagating parallel to the light-sensitive area 11. With this approach, only one row R on each side of the light-sensitive surface 11 is required since there are no gaps within the ring structure 32. Alternatively, the vias 31 outside the light-sensitive area 11 may be of rectangular cross section to achieve a large via-to-void ratio and hence to efficiently limit any direct path S through the via structure 30 by means of merely two rows R, for example, on each side of the light-sensitive surface 11. In case of no strict space constraints, square or circular cross section vias 31 may be chosen at the expense of requiring multiple, for example four, rows R on each side of the light-sensitive surface 11.

The embodiments shown in the FIGS. 1 to 11 as stated represent exemplary embodiments of the optical sensor device 1 and the arrangement of the via structure 30, therefore they do not constitute a complete list of all embodiments according to the improved concept. Actual optical sensor devices and via structure arrangements may vary from the embodiments shown in terms of shape, size and materials, for example.

The invention claimed is:

1. An optical sensor device, comprising:
   a semiconductor body having a light-sensitive area;
   metal layers arranged above the light-sensitive area and comprising an upper metal layer and a lower metal layer, the upper metal layer located at a greater distance from the light-sensitive area than the lower metal layer;
   an aperture opening in the metal layers above the light-sensitive area;
   a via structure arranged outside the aperture opening and interconnecting the metal layers and/or the semiconductor body;
   wherein
   the via structure is arranged in such a fashion that any straight line that is parallel to the light-sensitive area and traverses the aperture opening between the light-sensitive area and the upper metal layer is limited in both of its opposite directions by the via structure.

2. The optical sensor device according to claim 1, wherein the via structure comprises a plurality of vias.

3. The optical sensor device according to claim 2, wherein each of the plurality of vias has a rectangular or a circular cross section.

4. The optical sensor device according to claim 2, wherein
   the plurality of vias is arranged in rows around the aperture opening following a longitudinal direction that is transverse to any straight line that is parallel to the light-sensitive area and traverses the aperture opening between the light-sensitive area and the upper metal layer;
   the vias succeed one another within the rows at distances forming a pattern that is the same for each of the rows; and
   the rows are arranged beside each other with their longitudinal directions aligned, the patterns of neighboring ones of the rows shifted in the longitudinal direction relative to one another.

5. The optical sensor device according to claim 4, wherein the vias succeed one another within the rows at equal distances.

6. The optical sensor device according to claim 4, wherein the aperture opening is rectangular; and
   the longitudinal directions of the rows are parallel to sides of a rectangle formed by the aperture opening.

7. The optical sensor according to claim 1, wherein the via structure comprises a ring structure.

8. The optical sensor according to claim 1, wherein at least a part of the via structure is made of an electrically conductive material.

9. The optical sensor according to claim 1, wherein the metal layers comprise at least one further metal layer arranged between the upper metal layer and the lower metal layer.

10. The optical sensor according to claim 1, further comprising:
a further light-sensitive area;
a further aperture opening in the metal layers above the further light-sensitive area; and
a further via structure arranged outside the further aperture opening and interconnecting the metal layers and/or the semiconductor body;
wherein
the further via structure is arranged in such a fashion that any straight line that is parallel to the further light-sensitive area and traverses the further aperture area between the further light-sensitive area and the upper metal layer is limited in both of its opposite directions by the further via structure.

11. The optical sensor according to claim 1, wherein the via structure is arranged as a means for limiting horizontal light propagation between the light-sensitive area, a further light-sensitive area of the semiconductor body and/or an application-specific integrated circuit, ASIC, of the semiconductor body, wherein the light propagation is limited in a straight line that is parallel to the light-sensitive area and traverses the optical sensor device between the light-sensitive area and the upper metal layer.

12. The optical sensor according to claim 1, wherein the light-sensitive area is configured to generate an electrical signal based on electromagnetic radiation incident on the light-sensitive area.

13. An electronic device comprising an optical sensor device according to claim 1.

14. The electronic device according to claim 13, wherein the optical sensor device is configured as a light sensor, such as an ambient light sensor, a proximity sensor or a time-of-flight sensor.

15. A method for manufacturing an optical sensor device, the method comprising:
providing a semiconductor body comprising a light-sensitive area;
arranging metal layers above the light-sensitive area, wherein the metal layers comprise
an upper metal layer and a lower metal layer, with the upper metal layer located at a greater distance from the light-sensitive area than the lower metal layer; and
an aperture opening in the metal layers above the light-sensitive area; and
arranging a via structure outside the aperture opening, wherein the via structure interconnects the metal layers and/or the semiconductor body; wherein
the via structure is arranged in such a fashion that any straight line that is parallel to the light-sensitive area and traverses the aperture opening between the light-sensitive area and the upper metal layer is limited in both of its opposite directions by the via structure.

16. The optical sensor device according to claim 2, wherein each of the plurality of vias has a square cross-section.

17. The optical sensor device according to claim 1, wherein at least a part of the via structure is made of a metal.

18. The optical sensor device according to claim 1, wherein the light-sensitive area is configured to generate an electrical signal based on light in the visible, ultraviolet and/or in the infrared spectral range incident on the light-sensitive area.

* * * * *